United States Patent
Lung et al.

(10) Patent No.: US 9,177,940 B2
(45) Date of Patent: Nov. 3, 2015

(54) FAULT-TOLERANT UNIT AND METHOD FOR THROUGH-SILICON VIA

(75) Inventors: Chiao-Ling Lung, Hsinchu County (TW); Yu-Shih Su, Yunlin County (TW); Shih-Chieh Chang, Hsinchu (TW); Yiyu Shi, Rolla, MO (US)

(73) Assignee: Industrial Technology Research Institute, Hsinchu (TW)

( * ) Notice: Subject to any disclaimer, the term of this patent is extended or adjusted under 35 U.S.C. 154(b) by 1050 days.

(21) Appl. No.: 13/236,661

(22) Filed: Sep. 20, 2011

(65) Prior Publication Data

US 2012/0248438 A1 Oct. 4, 2012

Related U.S. Application Data

(60) Provisional application No. 61/468,078, filed on Mar. 28, 2011.

(30) Foreign Application Priority Data

Jun. 9, 2011 (TW) .............................. 100120191 A

(51) Int. Cl.
*H03K 19/00* (2006.01)
*H01L 25/065* (2006.01)
(Continued)

(52) U.S. Cl.
CPC ............ *H01L 25/0657* (2013.01); *H01L 23/481* (2013.01); *H01L 2224/16146* (2013.01); *H01L 2225/06544* (2013.01)

(58) Field of Classification Search
CPC ........ G01R 31/04; H01L 23/58; H03K 17/00; H03K 17/687

USPC ............ 257/48, E21.531, E23.002, 734–774; 438/666–668; 326/10, 37–41, 26, 27, 326/47, 82–87, 101; 327/108–112, 327/379–381, 384, 385, 387, 389, 391, 427, 327/434
See application file for complete search history.

(56) References Cited

U.S. PATENT DOCUMENTS 7,692,448 B2 4/2010 Solomon
7,830,692 B2 * 11/2010 Chung et al. ................... 365/51
(Continued)

OTHER PUBLICATIONS

Tak-Yung Kim, et al., "Clock Tree Synthesis with Pre-bond Testability for 3D Stacked IC Designs", Jun. 13-18, 2010, 47th ACM/IEEE Design Automation Conference (DAC) 2010, p. 723-728.*
(Continued)

*Primary Examiner* — Jany Richardson
(74) *Attorney, Agent, or Firm* — Jianq Chyun IP Office

(57) ABSTRACT

A fault-tolerant unit and a fault-tolerant method for through-silicon via (TSV) are provided. The fault-tolerant unit includes TSV structures TSV1~TSVn, nodes $N1_1$~$N1_n$, nodes $N2_1$~$N2_n$ and a switching module. The TSV structure TSVi is connected between the node $N1_i$ of the first chip and the node $N2_i$ of the second chip, wherein 1≤i≤n. The switching module is connected between the nodes $N2_1$~$N2_n$ of the second chip and a test path of the second chip. In normal operation state, the switching module disconnects the test path and the nodes $N2_1$~$N2_n$ when the TSV structures TSV1~TSVn are valid. The switching module connects the node $N2_i$ to at least another one of the nodes $N2_1$~$N2_n$ when the TSV structure TSVi is faulty in the normal operation state. In test status, the switching module connects the test path to the nodes $N2_1$~$N2_n$.

15 Claims, 8 Drawing Sheets

(51) Int. Cl.
*H01L 25/00* (2006.01)
*H01L 23/48* (2006.01)

(56) References Cited

U.S. PATENT DOCUMENTS

| | | | |
|---|---|---|---|
| 7,863,960 B2 | 1/2011 | Wang et al. | |
| 8,890,607 B2* | 11/2014 | Huang | H01L 23/50 257/776 |
| 2008/0204104 A1 | 8/2008 | Peng | |
| 2009/0091333 A1 | 4/2009 | Chung et al. | |
| 2010/0060310 A1* | 3/2010 | Laisne | H01L 25/0657 326/10 |
| 2010/0277210 A1 | 11/2010 | Wang et al. | |
| 2011/0234285 A1* | 9/2011 | Kim et al. | 327/292 |
| 2013/0049827 A1* | 2/2013 | Bucelot et al. | 327/144 |
| 2014/0111269 A1* | 4/2014 | Huang | G01R 31/3187 327/404 |

OTHER PUBLICATIONS

Albrecht et al., "On the Skew-Bounded Minimum-Buffer Routing Tree Problem", IEEE Transactions on Computer-Aided Design of Integrated Circuit and Systems, Jul. 2003, pp. 937-945, vol. 22, No. 7.

Cong et al., "Matching-Based Methods for High-Performance Clock Routing", IEEE Transactions on Computer-Aided Design of Integrated Circuit and Systems, Aug. 1993, pp. 1157-1169, vol. 12, No. 8.

Davis et al., "Demystifying 3D ICs: The Pros and Cons of Going Vertical", IEEE Design and Test of Computers, Nov. 2005, pp. 498-510.

Edahiro et al., "An Efficient Zero-Skew Routing Algorithm", In Proceedings of DAC., Jun. 6-10, 1994, pp. 375-380.

Hsieh et al, "TSV Redundancy: Architecture and Design Issues in 3D IC", In Proceedings of Design, Automation & Test in Europe Conference & Exhibition (DATE), Mar. 8-12, 2010, pp. 166-171.

Hu et al., "Fast Algorithms for Slew Constrained Minimum Cost Buffering", In Proceedings of Design Automation Conference, Jul. 24-28, 2006, pp. 308-313.

Kang et al, "8Gb 3D DDR3 DRAM Using Through-Silicon-Via Technology", IEEE International Solid-State Circuits Conference, Feb. 8-12, 2009, pp. 130-131, 131a.

Kawano et al, "A 3D Packaging Technology for 4 Gbit Stacked DRAM with 3 Gbps Data Transfer", In Proceedings of International Electron Devices Meeting, Dec. 11-13, 2006, pp. 1-4.

Kim et al., "Clock Tree Synthesis With Pre-bond Testability for 3D Stacked IC Designs", In Proceedings of the 47th Design Automation Conference, Jun. 13-18, 2010, pp. 723-728.

Lewis et al., "A Scan-Island Based Design Enabling Pre-bond Testbility in Die-Stacked Microprocessors", IEEE International Test Conference, Oct. 21-26, 2007, pp. 1-8.

Loi et al., "A Low-overhead Fault Tolerance Scheme for TSV-based 3D Network on Chip Links", In Proceeding of International Conference on Computer-Aided Design, Nov. 10-13, 2008, pp. 598-602.

Minz et. al., "Buffered Clock Tree Synthesis for 3D ICs Under Thermal Variations", In Proceedings of Asia and South Pacific Design Automation Conference, Mar. 21-24, 2008, pp. 504-509.

Mondal et al., "Thermally Robust Clocking Schemes for 3D Integrated Circuits", In Proceedings of Design Automation Conference, Apr. 16-20, 2007, pp. 1206-1211.

Papanikolaou et al., "Reliability issues in deep deep sub-micron technologies: time-dependent variability and its impact on embedded system design", In Proceedings of 13th IEEE International On-Line Testing Symposium, 2007, p. 342.

Pavlidis et al., "Clock Distribution Networks for 3-D Integrated Circuits", IEEE 2008 Custom Intergrated Circuits Conference, 2008, pp. 651-654.

Plas et al., "Design Issues and Considerations for Low-Cost 3D TSV IC Technology", IEEE International Solid-State Circuits Conference, Feb. 7-11, 2010, pp. 148-150.

Topol et al., "Three-dimensional integrated circuits", IBM Journal of Research and Development, Jul./ Sep. 2006, pp. 491-506.

Yoshikawa et al., "Chip-Scale Camera Module (CSCM) Using Through-Silicon-Via (TSV)", IEEE International Solid-State Circuits Conference, Feb. 8-12, 2009, pp. 476-477, 477a.

Zhao et al, "Pre-bond Testable Low-Power Clock Tree Design for 3D Stacked ICs", In Proceedings of ICCAD, Nov. 2-5, 2009, pp. 184-190.

Arunachalam et al., "Low-Power Clock Distribution in a Multilayer Core 3D Microprocessor", In Proceedings of the 18th ACM Great Lakes Symposium on VLSI, May 4-6, 2008, pp. 429-434.

Kao et al., "An Efficient Phase Detector Connection Structure for the Skew Synchronization System", In Proceedings of the 47th Design Automation Conference, Jun. 13-18, 2010, pp. 729-734.

Lung et al, "Clock Skew Optimization Considering Complicated Power Modes", In Proceedings of the Conference on Design, Automation and Test in Europe, Mar. 8-12, 2010, pp. 1474-1479.

Su et al., "Value Assignment of Adjustable Delay Buffers for Clock Skew Minimization in Multi-Voltage Mode Designs", In Proceedings of the 2009 International Conference on Computer-Aided Design, Nov. 2-5, 2009, pp. 535-538.

Lung et al, "Robust 3D Clock Scheme" with the agenda of 2011 TAU Workshop Program (Tentative), Mar. 31, 2011, pp. 1-9.

"Office Action of China Counterpart Application", issued on Apr. 15, 2014, p. 1-p. 7.

* cited by examiner

FAULT-TOLERANT UNIT AND METHOD FOR THROUGH-SILICON VIA

CROSS-REFERENCE TO RELATED APPLICATION

This application claims the priority benefits of U.S. provisional application Ser. No. 61/468,078, filed on Mar. 28, 2011 and Taiwan application serial no. 100120191, filed on Jun. 9, 2011. The entirety of each of the above-mentioned patent applications is hereby incorporated by reference herein and made a part of this specification.

BACKGROUND

1. Technical Field

The disclosure relates to a chip stacking structure having through-silicon vias (TSVs). Particularly, the disclosure relates to a fault-tolerant unit and a fault-tolerant method for TSV.

2. Related Art

A three-dimensional (3D) integrated circuit (IC) is a chip stacking structure formed by stacking a plurality of chips. FIG. 1 is a schematic diagram of a conventional chip stacking structure. The chip stacking structure 100 includes a chip 110 and a chip 120, and a plurality of through-silicon via (TSV) structures is disposed between the chip 110 and the chip 120. Based on considerations of circuit layout and winding, a same signal or power can be transmitted between the two adjacent chips 110 and 120 through the TSV structures. The TSV structure includes a TSV, a pad and a micro bump, wherein the TSV is disposed in the chip 110 of the upper layer, and the pad and the micro bump are disposed between the chip 110 and the chip 120.

For example, the TSV structures TSV1, TSV2 and TSV3 shown in FIG. 1 transmit a clock signal CLK of the chip 110 to different clock trees in the chip 120. The appearances of the TSV structures TSV1, TSV2 and TSV3 shown FIG. 1 are only drawn as an example. However, once the TSV structure is faulty, the 3D IC cannot normally work due to failure of signal transmission. Therefore, performance of the TSV structures is one of important factors influencing a yield of the 3D ICs.

SUMMARY

The disclosure is directed to a fault-tolerant unit and a fault-tolerant method for through-silicon via (TSV). The fault-tolerant unit has a TSV fault-tolerant effect without adding additional TSV structures.

The disclosure provides a fault-tolerant unit for TSV including n TSV structures TSV1-TSVn, n nodes $N1_1$-$N1_n$, n nodes $N2_1$-$N2_n$ and a switch module. The nodes $N1_1$-$N1_n$ are disposed on a first chip of a chip stacking structure. The nodes $N2_1$-$N2_n$ are disposed on a second chip of the chip stacking structure. The TSV structure TSVi is electrically connected between the node $N1_i$ and the node $N2_i$, where $1 \leq i \leq n$. The switch module is disposed on the second chip. The switch module is connected between the nodes $N2_1$-$N2_n$ and a test path of the second chip. In a normal operation state, the switch module disconnects the test path and the nodes $N2_1$-$N2_n$ when the TSV structures TSV1-TSVn are valid. The switch module connects the node $N2_i$ to at least one of the other nodes $N2_1$-$N2_n$ when the TSV structure TSVi is faulty in the normal operation state. In a test state, the switch module connects the test path to the nodes $N2_1$-$N2_n$.

The disclosure provides a fault-tolerant method for TSV, which includes following steps. n TSV structures TSV1-TSVn are configured between a first chip and a second chip of a chip stacking structure, where the TSV structure TSVi is electrically connected between a first node $N1_i$ of the first chip and a second node $N2_i$ of the second chip, where $1 \leq i \leq n$, and n is an integer. A switch module is disposed on the second chip, where the switch module is connected between the second nodes $N2_1$-$N2_n$ and a test path of the second chip. In a normal operation state, the switch module disconnects the test path and the second nodes $N2_1$-$N2_n$ when the TSV structures TSV1-TSVn are valid. In the normal operation state, the switch module connects the second node $N2_i$ to at least one second node $N2_j$ (where j is not equal to i) of the other second nodes when the TSV structure TSVi is faulty. In a test state, the switch module connects the test path to the second nodes $N2_1$-$N2_n$.

According to the above descriptions, the TSV structures TSV1-TSVn having the same signal characteristic in the chip stacking structure are used to form a fault-tolerant unit, and the fault-tolerant unit is unnecessary to add additional TSV structures. Namely, in the normal operation state, the TSV structures TSV1-TSVn respectively transmit a plurality of signals (for example, clock signals) having the same characteristic from the first chip to a plurality of circuit modules (for example, clock trees) of the second chip. When the TSV structure TSVi is faulty and cannot transmit a signal to the node $N2_i$ of the second chip, the switch module can transmit a signal (a signal having the same characteristic) of the other TSV structure to the node $N2_i$. Therefore, the fault-tolerant unit of the disclosure may have a TSV fault tolerant effect.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
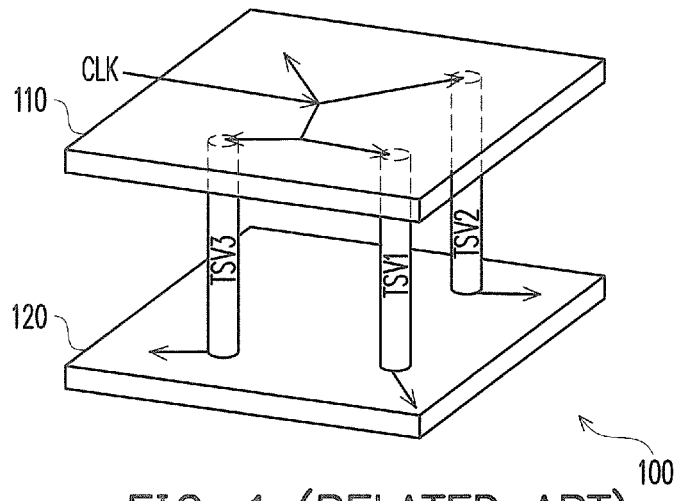
FIG. 1 is a schematic diagram of a conventional chip stacking structure.
Figure 2:
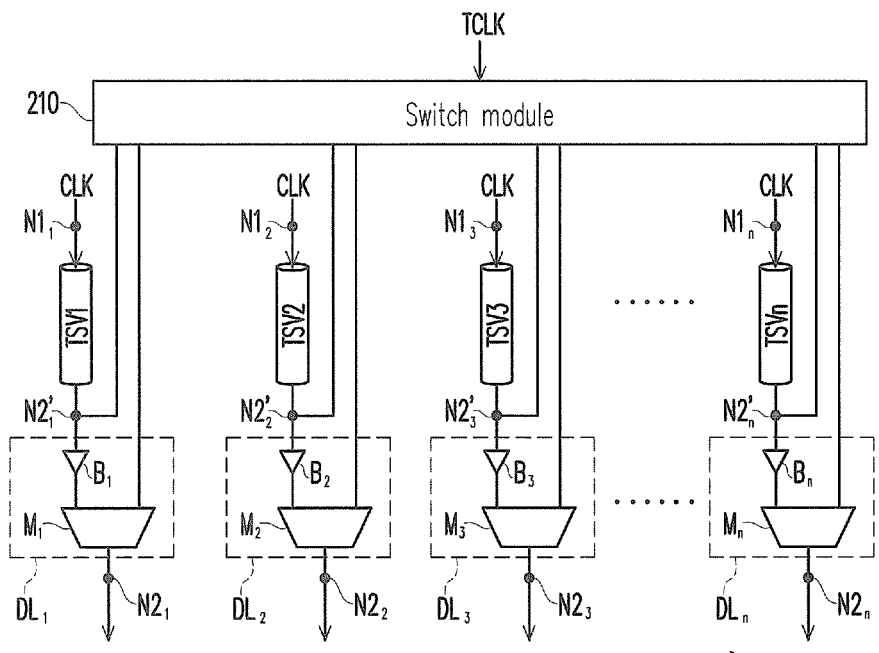
FIG. 2 is a functional block schematic diagram of a fault-tolerant unit for through-silicon via (TSV) according to an exemplary embodiment of the disclosure.

FIG. 2 is a functional block schematic diagram of a fault-tolerant unit for through-silicon via (TSV) according to an exemplary embodiment of the disclosure. The fault-tolerant unit 200 for TSV includes n TSV structures (for example, TSV1, TSV2, TSV3, ..., TSVn in FIG. 2), n first nodes (for example, $N1_1$, $N1_2$, $N1_3$, ..., $N_n$ in FIG. 2), n second nodes (for example, $N2_1$, $N2_2$, $N2_3$, ..., $N2_n$ in FIG. 2), and a switch module 210, where n is an integer. The first nodes $N1_1$-$N1_n$, are disposed on a first chip of a chip stacking structure, and the second nodes $N2_1$-$N2_n$ are disposed on a second chip of the chip stacking structure, where the first chip is stacked on the second chip. After the first chip is stacked on the second chip, the TSV structure TSVi is electrically connected between the first node $N1_i$ and the second node $N2_i$, where $1 \leq i \leq n$.

The switch module 210 is disposed on the second chip. The switch module 210 is connected between the second nodes $N2_1$-$N2_n$ and a test path of the second chip, and is coupled to nodes $N2_1'$, $N2_2'$, $N2_3'$, ..., $N2_n'$ in FIG. 2. The aforementioned test path is a redundant path for verifying a function of the second chip before chip stacking. Before the chip stacking, a verification/test platform can provide a clock signal TCLK to the second chip through the test path, so as to verify the function of the second chip. Therefore, in such test state, the TSV structures TSV1-TSVn are still not connected to the nodes $N2_1'$-$N2_n'$, and the switch module 210 connects the test path used for transmitting the clock signal TCLK to the second nodes $N2_1$-$N2_n$.

In the present embodiment, the fault-tolerant unit 200 for TSV further includes n delay adjustment modules (for example, $DL_1$, $DL_2$, $DL_3$, ..., $DL_n$ in FIG. 2) disposed on the second chip. The second nodes $N2_1$-$N2_n$ are respectively connected to different clock trees in the second chip. The delay adjustment module $DL_i$ is coupled between the second node $N2_i$ and the TSV structure $TSV_i$, and coupled between the second node $N2_i$ and the switch module 210, as that shown in FIG. 2. In such test state, the delay adjustment modules $DL_1$-$DL_n$ respectively transmit the clock signal TCLK from the switching module 210 to the second nodes $N2_1$-$N2_n$ by approximately a same delay amount.

After the chip stacking, the TSV structure TSVi is electrically connected between the first node $N1_i$ and the node $N2_i'$, and the aforementioned test path on the second chip for transmitting the clock signal TCLK is blocked from the second nodes $N2_1$-$N2_n$ by the switch module 210. In a normal operation state, ideally, the TSV structures TSV1-TSVn are all valid, namely, the TSV structures TSV1-TSVn can respectively transmit the clock signal CLK from the first nodes $N1_1$-$N1_n$ in the first chip to the nodes $N2_1'$-$N2_n'$. In the normal operation state, when the TSV structures TSV1-TSVn are all valid, the switch module 210 disconnects the test path and the second nodes $N2_1$-$N2_n$, and the delay adjustment modules $DL_1$-$DL_n$ respectively transmit the clock signal CLK from the TSV structures TSV1-TSVn to the second nodes $N2_1$-$N2_n$ through the nodes $N2_1'$-$N2_n'$ by a first delay time.

In the normal operation state, when the TSV structure TSVi in the TSV structures TSV1-TSVn is faulty, the switch module 210 connects the second node $N2_i$ to at least one second node $N2_j'$ (where j is not equal to i) of the other second nodes, and the delay adjustment module $DL_i$ transmits the clock signal CLK between the switch module 210 and the second node $N2_i$ by a second delay time smaller than the first delay time (without passing through a buffer $B_i$). For example, when the TSV structure TSV1 is faulty, the switch module 210 connects the second node $N2_1$ to at least one of the other second nodes $N2_2'$-$N2_n'$ (for example, the second node $N2_3'$), and disconnects the other second nodes (for example, $N2_2'$ and $N2_n'$) and the test path, namely, connects the second node $N2_1$ to the node $N2_3'$. Therefore, the clock tree corresponding to the TSV structure TSV1 can obtain the clock signal CLK through the TSV structure TSV3 and the switch module 210. Moreover, a delay time of the delay adjustment module $DL_1$ is less than a delay time of the delay adjustment module $DL_3$ to compensate a signal delay amount of the clock signal CLK passing through the switch module 210.

In the present exemplary embodiment, any means can be used to set a connection state (a connection configuration) of the delay adjustment modules $DL_1$-$DL_n$ and the switch module 210. For example, the connection state of the switch module 210 is set by a fuse mechanism. If it is discovered that the TSV structure TSV1 is faulty in the test/verification performed after the chip stacking, a fuse configuration is changed in a subsequent process to set the connection state of the switch module 210 to be as that described above. Alternatively, a detecting circuit is used to set the connection state (the connection configuration) of the delay adjustment modules $DL_1$-$DL_n$ and the switch module 210. For example, when the detecting circuit detects that the TSV structure TSV1 is faulty, or when the detecting circuit detects that the node $N2_1'$ does not have the clock signal, the detecting circuit can automatically control the connection state of the switch module 210 to be as that described above.

In the present embodiment, the delay adjustment module $DL_i$ includes a buffer $B_i$ and a multiplexer $M_i$. For example, the delay adjustment module $DL_1$ includes a buffer $B_1$ and a multiplexer $M_1$, the delay adjustment module $DL_2$ includes a buffer $B_2$ and a multiplexer $M_2$, the delay adjustment module $DL_3$ includes a buffer $B_3$ and a multiplexer $M_3$, and the delay adjustment module $DL_n$ includes a buffer $B_n$ and a multiplexer $M_n$. An input terminal of the buffer $B_i$ is coupled to the TSV structure TSVi through the node $N2_i'$. A first input terminal of the multiplexer $M_i$ is coupled to an output terminal of the buffer $B_i$, a second input terminal of the multiplexer $M_i$ is coupled to the switch module 210, and an output terminal of the multiplexer $M_i$ is coupled to the second node $N2_i$. When the TSV structure TSVi is faulty, the multiplexer $M_i$ selects to connect the switch module 210 to the second node $N2_i$. When the TSV structure TSVi is valid, the multiplexer $M_i$ selects to connect the output terminal of the buffer $B_i$ to the second node $N2_i$. For example, when the TSV structure TSV1 is faulty, the switch module 210 connects the second node $N2_1$ to the TSV structure TSV3 through the node $N2_3'$, the multiplexer $M_1$ selects to connect the switch module 210 to the second node $N2_1$, and the multiplexer $M_3$ selects to connect the output terminal of the buffer $B_3$ to the second node $N2_3$. Therefore, the delay time of the delay adjustment module $DL_1$ is smaller than the delay time of the delay adjustment module $DL_3$ to compensate a signal delay amount of the clock signal CLK passing through the switch module 210.

If the signal delay amount for the switch module 210 transmitting the clock signal CLK is smaller than a circuit design specification, namely, the signal delay amount of the switch module 210 is tolerable, the buffers $B_1$-$B_n$ can be omitted/removed. If the buffers $B_1$-$B_n$ are omitted, the first input terminal of the multiplexer $M_i$ is directly connected to the node $N2_i'$.

According to FIG. 2, the fault-tolerant unit 200 for TSV is unnecessary to add any redundant TSV structures, and implements a TSV fault-tolerant effect. In the normal operation state, the TSV structures TSV1-TSVn respectively supply the clock signal CLK to different clock trees. When the TSV structure TSVi in the TSV structures TSV1-TSVn is faulty, the switch module 210 can change an electrical path of the TSV structures TSV1-TSVn, so that the clock tree corresponding to the faulty TSV structure TSVi can obtain the clock signal CLK. Therefore, the fault-tolerant unit 200 for TSV can improve a chip stacking yield.

Figure 3:
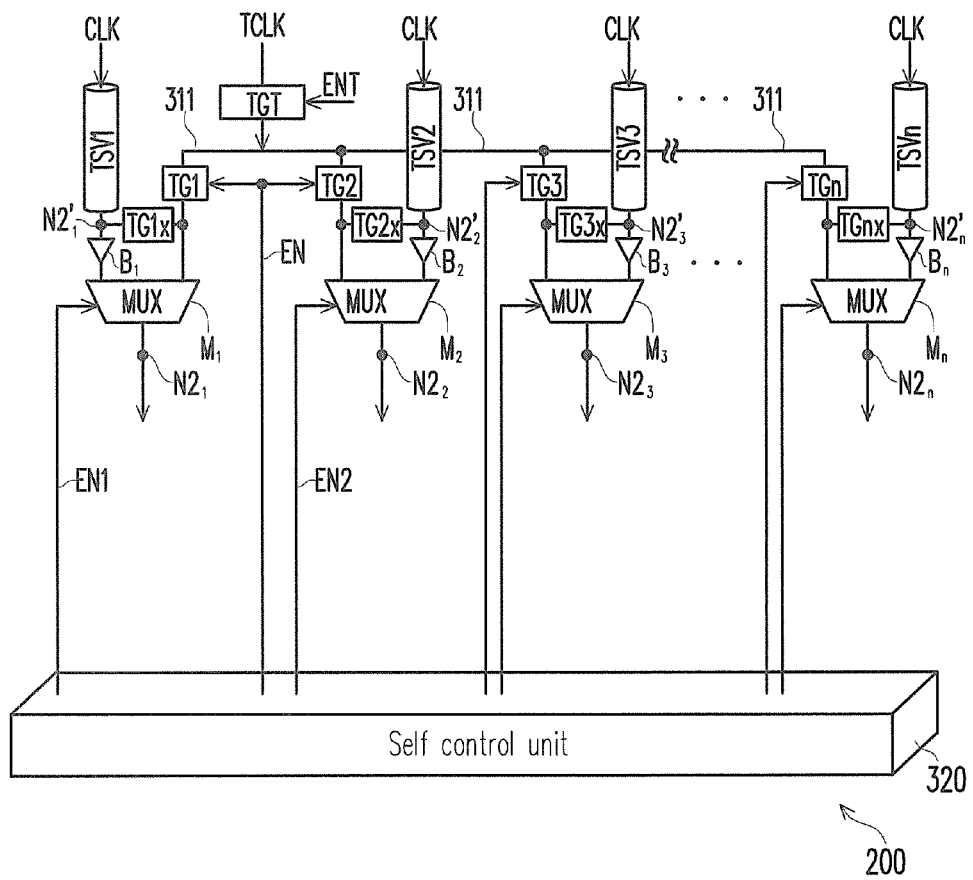
FIG. 3 is a functional block schematic diagram of a switch module of FIG. 2 according to an exemplary embodiment of the disclosure.

FIG. 3 is a functional block schematic diagram of the switch module 210 of FIG. 2 according to an exemplary embodiment of the disclosure. Related descriptions of FIG. 2 can be referred for descriptions of the embodiment of FIG. 3. Referring to FIG. 2 and FIG. 3, the switch module 210 includes a redundant path 311, a test switch TGT, n first fault-tolerant switches (for example, TG1, TG2, TG3, ..., TGn) and n second fault-tolerant switches (for example, TG1x, TG2x, TG3x, ..., TGnx). The test switch TGT, the first fault-tolerant switches TG1-TGn and the second fault-tolerant switches TG1x-TGnx can be switches, transmission gates, transistors, AND gates or fuse circuits, etc. A plurality of detecting terminals of a self control unit 320 are respectively connected to the nodes $N2_1'$-$N2_n'$ (or the second ends of the TSV structures TSV1-TSVn). A plurality of output terminals of the self control unit 320 are respectively connected to control terminals of the multiplexers $M_1$-$M_n$, control terminals of the first fault-tolerant switches TG1-TGn, control terminals of the second fault-tolerant switches TG1x-TGnx and a control terminal of the test switch TGT. When the node $N2_i'$ has a signal (or when the TSV structure TSVi is valid), the self control unit 320 controls the multiplexer $M_i$ to connect the output terminal of the buffer $B_i$ to the second node $N2_i$. When the node $N2_i'$ does not have the signal (or the TSV structure TSVi is faulty), the self control unit 320 controls the multiplexer $M_i$ to connect the first fault-tolerant switch TGi to the second node $N2_i$.

The test switch TGT is connected between the redundant path 311 and the test path used for transmitting the clock signal TCLK. The test switch TGT is controlled by the self control unit 320. When the test path for transmitting the clock signal TCLK has a signal, the self control unit 320 controls the test switch TGT to connect the test path to the redundant path 311. Before the chip stacking, the TSV structures TSV1-TSVn are still not connected to the nodes $N2_1'$-$N2_n'$ on the second chip of the lower layer, and the self control unit 320 turns on the test switch TGT. The clock signal TCLK can be transmitted to the redundant path 311 to test the second chip. After the chip stacking, the test path no longer transmits the clock signal TCLK, and the fault-tolerant unit 200 for TSV can be operated in the normal operation state, so that the self control unit 320 turns off the test switch TGT.

The first terminal of the first fault-tolerant switch TGi in the first fault-tolerant switches TG1-TGn is connected to the redundant path 311, and the second terminal of the first fault-tolerant switch TGi is connected to the second node $N2_i$ through the multiplexer Mi. The first terminal of the second fault-tolerant switch TGix in the second fault-tolerant switches TG1x-TGnx is connected to the TSV structure TSVi through the node $N2_i'$, and the second terminal of the second fault-tolerant switch TGix is connected to the second terminal of the first fault-tolerant switch TGi. The first fault-tolerant switches TG1-TGn and the second fault-tolerant switches TG1x-TGnx are controlled by the self control unit 320. In the test state before the chip stacking, none of the nodes $N2_1'$-$N2_n'$ has a signal, and the self control unit 320 turns on the first fault-tolerant switches TG1-TGn and turns off the second fault-tolerant switches TG1x-TGnx. Therefore, the clock signal TCLK can be transmitted to different clock trees of the second chip through the test switch TGT, the redundant path 311, the first fault-tolerant switches TG1-TGn, the multiplexers $M_1$-$M_n$ and the second nodes $N2_1$-$N2_n$, so as to test the second chip. In the normal operation state after the chip stacking, when the TSV structures TSV1-TSVn are all valid, the nodes $N2_1'$-$N2_n'$ all have signals, and the self control unit 320 turns off the first fault-tolerant switches TG1-TGn, so that the switch module 210 does not interfere a normal operation of the second chip. Now, whether the second fault-tolerant switches TG1x-TGnx are all in a turn on state or a turn off state, the normal operation of the second chip is not influenced.

In the normal operation state, when the TSV structure TSVi in the TSV structures TSV1-TSVn is faulty, namely, the node $N2_i'$ does not has the signal, the self control unit 320 turns on the first fault-tolerant switch TGi and another first fault-tolerant switch TGj in the first fault-tolerant switches TG1-TGn, and turns off the other first fault-tolerant switches, and further turns off the second fault-tolerant switch TGix and turns on the other second fault-tolerant switches. For example, when the TSV structure TSV1 is faulty, the self control unit 320 turns on the first fault-tolerant switch TG1 and another first fault-tolerant switch (for example, the first fault-tolerant switch TG3) in the first fault-tolerant switches TG1-TGn, and turns off the other first fault-tolerant switches (for example, the first fault-tolerant switches TG2 and TGn in the FIG. 3), and further turns off the second fault-tolerant switch TG1x and turns on the other second fault-tolerant switches TG2x-TGnx. Therefore, besides that the clock signal CLK is transmitted to the clock tree corresponding to the TSV structure TSV3 through the TSV structure TSV3, the buffer $B_3$, the multiplexer $M_3$ and the second node $N2_3$, it is also transmitted to the clock tree corresponding to the TSV structure TSV1 through the TSV structure TSV3, the second fault-tolerant switch TG3x, the first fault-tolerant switch TG3, the redundant path 311, the first fault-tolerant switch TG1, the multiplexer $M_1$ and the second node $N2_1$.

Figure 4A:
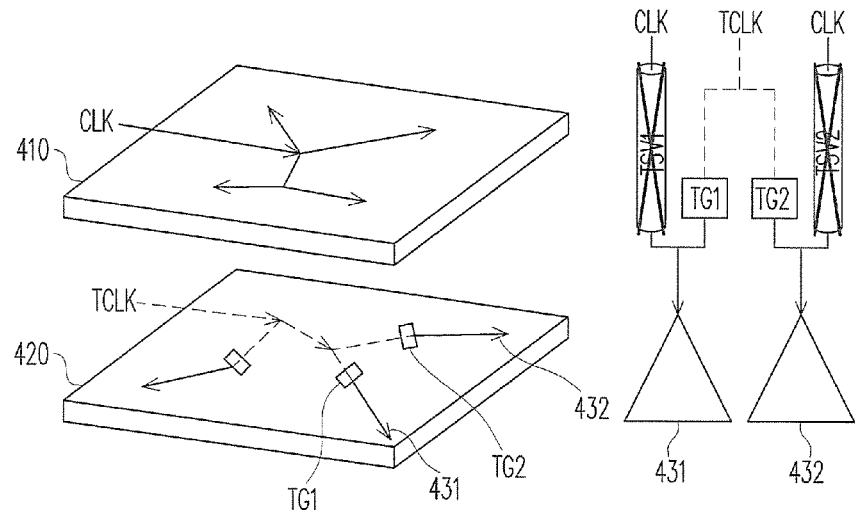
FIG. 4A is a schematic diagram of test/verification performed before stacking a first chip and a second chip.

In the following descriptions, two TSV structures (n=2) are taken as an example to describe implementation details of the fault-tolerant unit 200 for TSV of FIG. 2. FIG. 4A is a schematic diagram of test/verification performed before stacking a first chip 410 and a second chip 420. Referring to a left part of FIG. 4A, the first chip 410 is configured with a clock tree to facilitate transmitting the clock signal CLK. The second chip 420 is configured with a test path (shown by a dot line) to facilitate transmitting the clock signal TCLK (used for testing) to different clock trees (for example, clock trees 431 and 432). The right part of FIG. 4 is an equivalent circuit of partial clock trees of the second chip 420 before the chip stacking. In the test state, the switches TG1 and TG2 are turned on. Therefore, the clock signal TCLK used for testing can be transmitted to the clock tree 431 through the test path and the switch TG1, and transmitted to the clock tree 432 through the test path and the switch TG2.

Figure 4B:
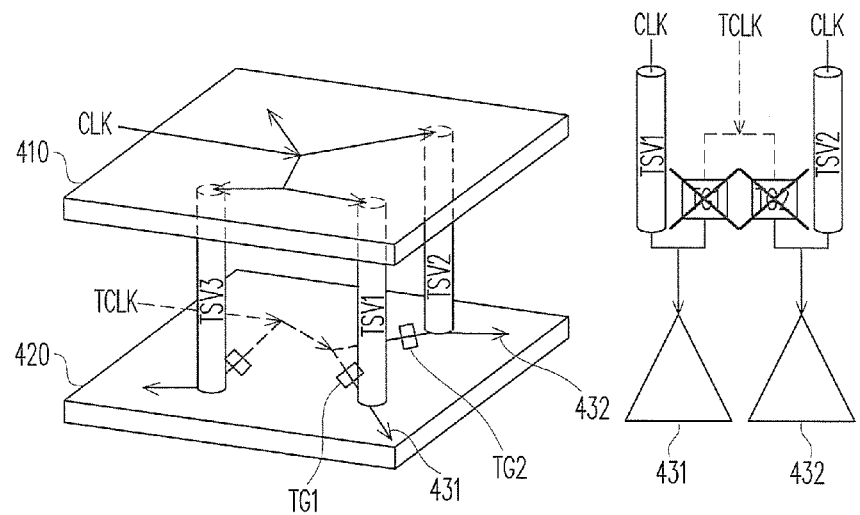
FIG. 4B is a schematic diagram of a normal operation of a first chip and a second chip after chip stacking.

FIG. 4B is a schematic diagram of a normal operation of the first chip 410 and the second chip 420 after chip stacking. Referring to a left part of FIG. 4B, the TSV structures TSV1, TSV2 and TSV3 are disposed between the first chip 410 and the second chip 420, so that the clock signal CLK of the first chip 410 can be transmitted to different clock trees of the second chip 420 through the TSV structures TSV1, TSV2 and TSV3. The right part of FIG. 4B is an equivalent circuit of partial clock trees of the second chip 420 after chip stacking. When the second chip 420 normally operates, the switches TG1 and TG2 are turned off, and the prior test path (shown by the dot lines) becomes a redundant path of the second chip 420. Based on isolation of the switches TG1 and TG2, the redundant path does not interfere transmission of the clock signal CLK. The clock signal CLK can be transmitted to the clock tree 431 from the first chip 410 through the TSV structure TSV1, and transmitted to the clock tree 432 through the TSV structure TSV2.

Figure 5:
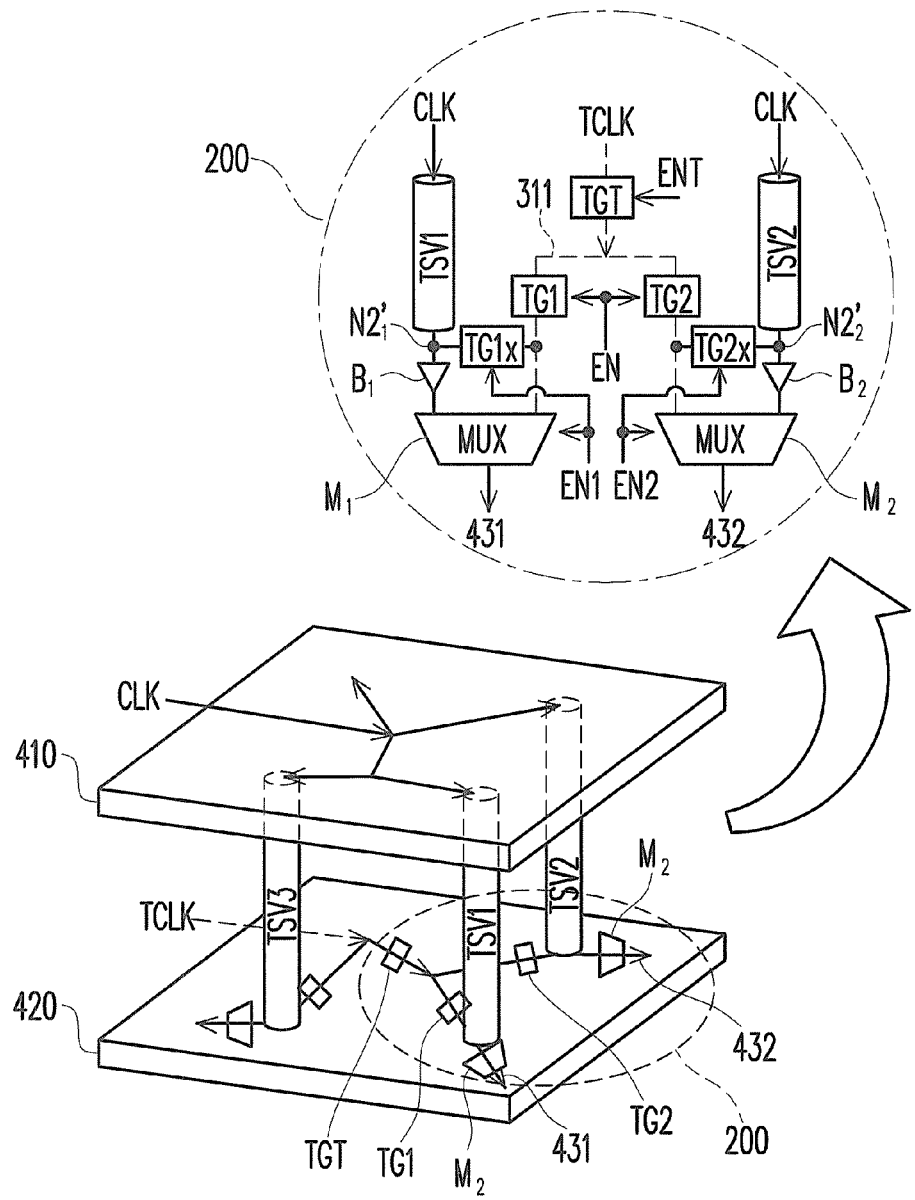
FIG. 5 is a schematic diagram of a fault-tolerant unit for TSV of FIG. 2 according to an exemplary embodiment of the disclosure.

FIG. 5 is a schematic diagram of the fault-tolerant unit 200 for TSV of FIG. 2 according to the exemplary embodiment of the disclosure. Related descriptions of FIG. 2, FIG. 3, FIG. 4A and FIG. 4B can be referred for descriptions of the exemplary embodiment of FIG. 5. Referring to the lower part of FIG. 5, the TSV structures TSV1, TSV2 and TSV3 are disposed between the first chip 410 and the second chip 420, so that the clock signal CLK of the first chip 410 can be transmitted to different clock trees of the second chip 420 through the TSV structures TSV1, TSV2 and TSV3.

The upper part of FIG. 5 is an equivalent circuit of the fault-tolerant unit 200 for TSV of the second chip 420 after chip stacking. Before the chip stacking, the self control unit 320 turns on the test switch TGT through a control signal ENT, turns on the first fault-tolerant switches TG1-TG2 through a control signal EN, and turns off the second fault-tolerant switches TG1x-TG2x through control signals EN1 and EN2. Meanwhile, the self control unit 320 controls the multiplexer $M_1$ to connect the first fault-tolerant switch TG1 of the switch module 210 to the clock tree 431 through the control signal EN1, and controls the multiplexer $M_2$ to connect the first fault-tolerant switch TG2 of the switch module 210 to the clock tree 432 through the control signal EN2. In the test state, the clock signal TCLK used for testing can be transmitted to the clock tree 431 through the test path, the redundant path 311, the switch TG1 and the multiplexer $M_1$, and transmitted to the clock tree 432 through the test path, the redundant path 311, the switch TG2 and the multiplexer $M_2$.

After the chip stacking, the second chip 420 can normally operate, and the self control unit 320 turns off the test switch TGT through the control signal ENT, so that the redundant path 311 is isolated from the test path. The self control unit 320 can detect the nodes $N2_1'$ and $N2_2'$ to identify whether the TSV structures TSV1 and TSV2 are faulty. When the TSV structures TSV1 and TSV2 are valid, the self control unit 320 turns off the first fault-tolerant switches TG1-TG2 through the control signal EN. Meanwhile, the self control unit 320 controls the multiplexer $M_1$ to connect the output terminal of the buffer $B_1$ to the clock tree 431 through the control signal EN1, and controls the multiplexer $M_2$ to connect the output terminal of the buffer $B_2$ to the clock tree 432 through the control signal EN2. Therefore, the clock signal CLK can be transmitted to the clock tree 431 through the TSV structure TSV1, the node $N2_1'$, the buffer $B_1$ and the multiplexer $M_1$, and the clock signal CLK can also be transmitted to the clock tree 432 through the TSV structure TSV2, the node $N2_2'$, the buffer $B_2$ and the multiplexer $M_2$.

When the TSV structure TSV1 is faulty, the self control unit 320 turns off the test switch TGT through the control signal ENT, turns on the first fault-tolerant switches TG1-TG2 through the control signal EN, turns off the second fault-tolerant switch TG1x through the control signal EN1, controls the multiplexer $M_1$ to connect the first fault-tolerant switch TG1 to the clock tree 431 through the control signal EN1, turns on the second fault-tolerant switch TG2x through the control signal EN2, and controls the multiplexer $M_2$ to connect the output terminal of the buffer $B_2$ to the clock tree 432 through the control signal EN2. Therefore, besides that the TSV structure TSV2 transmits the clock signal CLK to the clock tree 432 through the node $N2_2'$, the buffer $B_2$ and the multiplexer $M_2$, the TSV structure TSV2 also transmits the clock signal CLK to the clock tree 431 through the node $N2_2'$, the second fault-tolerant switch TG2x, the first fault-tolerant switch TG2, the redundant path 311, the first fault-tolerant switch TG1 and the multiplexer $M_1$. A delay time of the buffer $B_2$ is approximately equal to a total delay time of the second fault-tolerant switch TG2x, the first fault-tolerant switch TG2, the redundant path 311 and the first fault-tolerant switch TG1. Therefore, the clock tree 431 corresponding to the faulty TSV structure TSV1 can obtain the clock signal CLK from the valid TSV structure TSV2.

Deduced by analogy, when the TSV structure TSV2 is faulty, the self control unit 320 controls the multiplexer $M_1$ to connect the output terminal of the buffer $B_1$ to the clock tree 431 through the control signal EN1, turns on the second fault-tolerant switch TG1x through the control signal EN1, turns off the second fault-tolerant switch TG2x through the control signal EN2, and controls the multiplexer $M_2$ to connect the first fault-tolerant switch TG2 to the clock tree 432 through the control signal EN2. Therefore, besides that the TSV structure TSV1 transmits the clock signal CLK to the clock tree 431 through the node $N2_1'$, the buffer $B_1$ and the multiplexer $M_1$, the TSV structure TSV1 also transmits the clock signal CLK to the clock tree 432 through the second fault-tolerant switch TG1x, the first fault-tolerant switch TG1, the redundant path 311, the first fault-tolerant switch TG2 and the multiplexer $M_2$. A delay time of the buffer $B_1$ is approximately equal to a total delay time of the second fault-tolerant switch TG1x, the first fault-tolerant switch TG1, the redundant path 311 and the first fault-tolerant switch TG2. Therefore, the clock tree 432 corresponding to the faulty TSV structure TSV2 can obtain the clock signal CLK from the valid TSV structure TSV1.

Table 1 is a truth table of the above switches TG1, TG2, TG1x, TG2x and TGT. The control signals ENT, EN, EN1 and EN2 used for controlling the switches TG1, TG2, TG1x, TG2x and TGT and the multiplexers $M_1$ and $M_2$ can be set according to a manual mechanism, or can be automatically set by the self control unit 320 according to the states of the TSV structures TSV1 and TSV2. Implementation of the self control unit 320 is described in detail later.

TABLE 1 truth table of the switches TG1, TG2, TG1x, TG2x, TGT and the multiplexers $M_1$ and $M_2$ of FIG. 5

| Stage | TSV structure | TGT | TG1 | TG2 | TG1x | TG2x | $M_1$ | $M_2$ |
|---|---|---|---|---|---|---|---|---|
| After stacking | Valid TSV1 is | OFF OFF | OFF ON | OFF ON | ON/OFF OFF | ON/OFF ON | TSV1 TSV2 | TSV2 TSV2 |

TABLE 1-continued truth table of the switches TG1, TG2, TG1x, TG2x,
TGT and the multiplexers $M_1$ and $M_2$ of FIG. 5

| Stage | TSV structure | TGT | TG1 | TG2 | TG1x | TG2x | $M_1$ | $M_2$ |
|---|---|---|---|---|---|---|---|---|
| | faulty | | | | | | (Not through buffer) | (Through buffer) |
| | TSV2 is faulty | OFF | ON | ON | ON | OFF | TSV1 (Through buffer) | TSV1 (Not through buffer) |
| Before stacking | None | ON | ON | ON | OFF | OFF | TCLK | TCLK |

In the table 1, when the TSV structures TSV1 and TSV2 are all valid (in a good state), the second fault-tolerant switches TG1x and TG2x can be turned on. In another exemplary embodiment, when the TSV structures TSV1 and TSV2 are all valid, the second fault-tolerant switches TG1x and TG2x can be turned off to avoid noises of the redundant path 311 and the first fault-tolerant switches TG1 and TG2 from interfering the clock signals CLK at the node $N2_1'$ and $N2_2'$.

Figure 6:
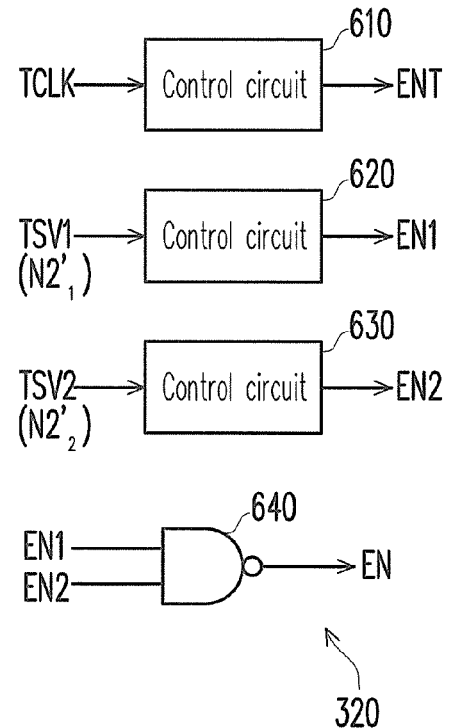
FIG. 6 is a functional block schematic diagram of a self control unit according to an exemplary embodiment of the disclosure.

FIG. 6 is a functional block schematic diagram of the self control unit 320 according to the exemplary embodiment of the disclosure. The self control unit 320 includes a first control circuit 610, a second control circuit 620, a third control circuit 630 and an NAND gate 640. The first control circuit 610 is used to detect the clock signal TCLK, and correspondingly generates the control signal ENT to the test switch TGT. When the clock signal TCLK does not exist, the control signal ENT is logic 0 to turn off the test switch TGT. When the first control circuit 610 detects the clock signal TCLK, the control signal ENT is logic 1 to turn on the test switch TGT. The second control circuit 620 is used to detect the TSV structure TSV1 (for example, detects whether the node $N2_1'$ has a signal), and correspondingly generates the control signal EN1 to the multiplexer $M_1$ and the second fault-tolerant switch TG1x. When the TSV structure TSV1 is faulty (for example, the node $N2_1'$ does not have a signal), the control signal EN1 is logic 0, so that the multiplexer $M_1$ selects to transmit the clock signal CLK output by the first fault-tolerant switch TG1 to the clock tree 431, and the second fault-tolerant switch TG1x is turned off in response to the control signal EN1 to avoid the output signal of the first fault-tolerant switch TG1 from interfering the second control circuit 620. When the second control circuit 620 detects that the TSV structure TSV1 is valid (for example, the node $N2_1'$ has a signal), the control signal EN1 is logic 1, so that the multiplexer $M_1$ selects to transmit the clock signal CLK output by the buffer $B_1$ to the clock tree 431, and the second fault-tolerant switch TG1x is turned on in response to the control signal EN1.

The third control circuit 630 is used to detect the TSV structure TSV2 (for example, detects whether the node $N2_2'$ has a signal), and correspondingly generates the control signal EN2 to the multiplexer $M_2$ and the second fault-tolerant switch TG2x. When the TSV structure TSV2 is faulty (for example, the node $N2_2'$ does not have a signal), the control signal EN2 is logic 0, so that the multiplexer $M_2$ selects to transmit the clock signal CLK output by the first fault-tolerant switch TG2 to the clock tree 432, and the second fault-tolerant switch TG2x is turned off in response to the control signal EN2 to avoid the output signal of the first fault-tolerant switch TG2 from interfering the third control circuit 630. When the third control circuit 630 detects that the TSV structure TSV2 is valid (for example, the node $N2_2'$ has a signal), the control signal EN2 is logic 1, so that the multiplexer $M_1$ selects to transmit the clock signal CLK output by the buffer $B_2$ to the clock tree 432, and the second fault-tolerant switch TG2x is turned on in response to the control signal EN2.

The first input terminal of the NAND gate 640 receives the control signal EN1 output by the second control circuit 620, the second input terminal of the NAND gate 640 receives the control signal EN2 output by the third control circuit 630, and an output terminal of the NAND gate 640 outputs the control signal EN to the first fault-tolerant switches TG1 and TG2. When the control signal EN1 and EN2 are all logic 1, namely, when the TSV structures TSV1 and TSV2 are all valid, the control signal EN turns off the first fault-tolerant switches TG1 and TG2, or otherwise turns on the first fault-tolerant switches TG1 and TG2.

Figure 7:
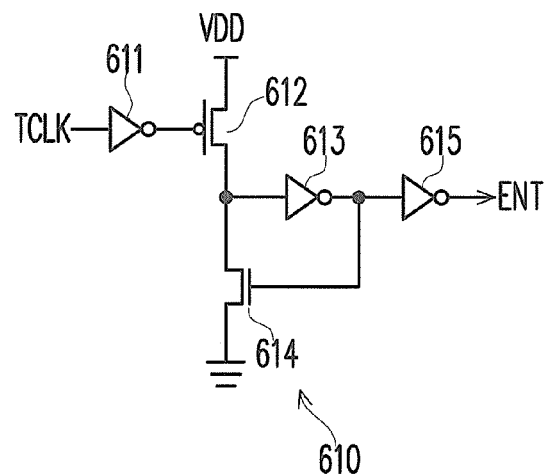
FIG. 7 is a circuit schematic diagram of a control circuit of FIG. 6 according to an exemplary embodiment of the disclosure.

FIG. 7 is a circuit schematic diagram of the first control circuit 610 of FIG. 6 according to the exemplary embodiment of the disclosure. Implementation of the other control circuits 620 and 630 of FIG. 6 can refer to the related descriptions of the control circuit 610. Referring to FIG. 7, the first control circuit 610 includes a NOT gate 611, a P-channel metal oxide semiconductor (PMOS) transistor 612, a NOT gate 613, an N-channel metal oxide semiconductor (NMOS) transistor 614 and a NOT gate 615. When the clock signal TCLK exists, the clock signal TCLK is regularly transited between the logic 1 and the logic 0. When the clock signal TCLK is the logic 1, the PMOS 612 is turned on, and the NOT gate 613 outputs the logic 0. The logic 0 output by the NOT gate 613 turns off the NMOS transistor 614, and the control signal ENT output by the NOT gate 615 is the logic 1. When the clock signal TCLK is the logic 0, the PMOS transistor 612 is turned off. In case that the PMOS transistor 612 and the NMOS transistor 614 are all turned off, a logic state of an input terminal of the NOT gate 613 is temporarily maintained to the logic 1 due to a parasitic capacitance, so that the NOT gate 613 outputs the logic 0. The logic 0 output by the NOT gate 613 turns off the NMOS transistor 614, and the control signal ENT output by the NOT gate 615 is maintained to the logic 1.

When the clock signal TCLK does not exist, an input terminal of the NOT gate 611 may have a state of the logic 0, a floating state or a high impedance state, so that an output terminal of the NOT gate 611 is maintained to the logic 1, and the PMOS transistor 612 is maintained to be turned off. In case that the NMOS transistor 614 is turned off, the logic state of the input terminal of the NOT gate 613 is transited from the logic 1 to the logic 0 within a predetermined time due to a leakage effect of the parasitic capacitance. Once the input terminal of the NOT gate 613 is the logic 0, the NMOS transistor 614 is turned on, and the control signal ENT output by the NOT gate 615 is transited to the logic 0. Therefore, the self control unit 320 can automatically control the test gate TGT according to presence or absence of the clock signal TCLK.

Figure 8:
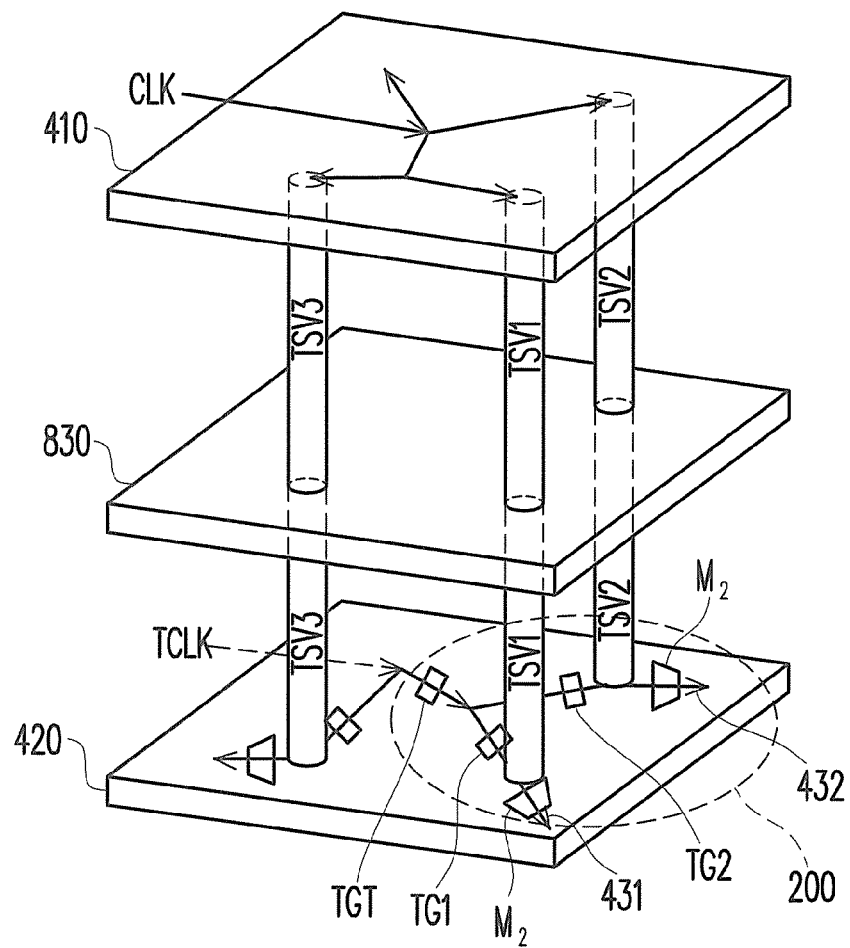
FIG. 8 is a schematic diagram of a fault-tolerant unit for TSV of FIG. 2 according to another exemplary embodiment of the disclosure.

The first chip 410 and the second chip 420 of the above exemplary embodiment are connected to each other, though the exemplary embodiment of the disclosure is not limited thereto. For example, FIG. 8 is a schematic diagram of the fault-tolerant unit 200 for TSV of FIG. 2 according to another exemplary embodiment of the disclosure. Related descriptions of FIG. 5 can be referred for the fault-tolerant unit 200 for TSV of FIG. 8. Different to the exemplary embodiment of FIG. 5, the chip stacking structure further includes at least one third chip 830. The at least one third chip 830 is stacked between the first chip 410 and the second chip 420, and the TSV structures TSV1-TSV3 penetrate through the at least one third chip 830 and are respectively connected between the first nodes $N1_1$-$N1_3$ and the second nodes $N2_1$-$N2_3$.

According to the above descriptions, a fault-tolerant method for TSV is provided below. The fault-tolerant method for TSV includes following steps. n TSV structures TSV1-TSVn are configured between the first chip and the second chip of a chip stacking structure, where the TSV structure TSVi is electrically connected between a first node $N1_i$ of the first chip and a second node $N2_i$ of the second chip, where $1 \leq i \leq n$, and n is an integer. A switch module is disposed on the second chip, where the switch module is connected between the second nodes $N2_1$-$N2_n$ and a test path of the second chip. In a normal operation state, the switch module disconnects the test path and the second nodes $N2_1$-$N2_n$ when the TSV structures TSV1-TSVn are valid. In the normal operation state, the switch module connects the second node $N2_i$ to at least one second node N2 of the other second nodes when the TSV structure TSVi is faulty. In a test state, the switch module connects the test path to the second nodes $N2_1$-$N2_n$.

In some embodiments, the fault-tolerant method for TSV further includes following steps. When the TSV structure TSVi is valid, a signal of the node $N2_1'$ is transmitted to a second node $N2_i$ of the second chip by a first delay time, and when the TSV structure TSVi is faulty, the signal of the first fault-tolerant switches TGi is transmitted to the second node $N2_i$ of the second chip by a second delay time less than the first delay time.

In the above exemplary embodiments, pseudo codes of fault-tolerant 3D clock network synthesis are as follows:

---

Inputs: A set of sinks distributed on N tiers
Outputs: A fault-tolerant 3D clock network with TFUs
    Initialization: put all sinks to the pool;
    while pool is not empty do
        bottom-up tree construction;
        if a TSVi,j is needed then
            search for the possible pairing TSVs within a feasible range T;
            if pairing TSVs are found then
                insert the TFU using the pairing TSV with the minimum distance to TSVi,j;
            else
                apply the double TSV technique;
            end if
        end if
        optimize slew and skew by inserting buffers;
        add parent nodes to the pool;
    end while
    synthesize the remainder of the 2D redundant tree in each tier.

---

In the above pseudo codes, TFU represents the aforementioned fault-tolerant unit 200 for TSV. "double TSV technique" represents a conventional fault-tolerant technique using redundant TSVs. The greater the "feasible range T" is, the longer the redundant path 311 is, and the greater the signal delay time is.

According to the above descriptions, the TSV structures TSV1-TSVn having the same signal characteristic in the chip stacking structure are used to form the fault-tolerant unit 200. It is unnecessary to add additional TSV structures to the fault-tolerant unit 200. Namely, in the normal operation state, the TSV structures TSV1-TSVn transmit a plurality of signals (for example, the clock signals CLK) having the same characteristic from the first chip 410 to a plurality of circuit modules (for example, the clock trees 431 and 432) of the second chip 420. The TSV structures TSV1-TSVn are not redundant TSVs. When the TSV structure TSVi is faulty, and cannot transmit the clock signal CLK to the node $N2_i$ of the second chip 420, the switch module 210 can transmit a signal (having the same characteristic) of the other TSV structure to the node $N2_i$. Therefore, the fault-tolerant unit 200 can achieve a TSV fault-tolerant effect for TSVs in the chip stacking structure.

Figure 9:
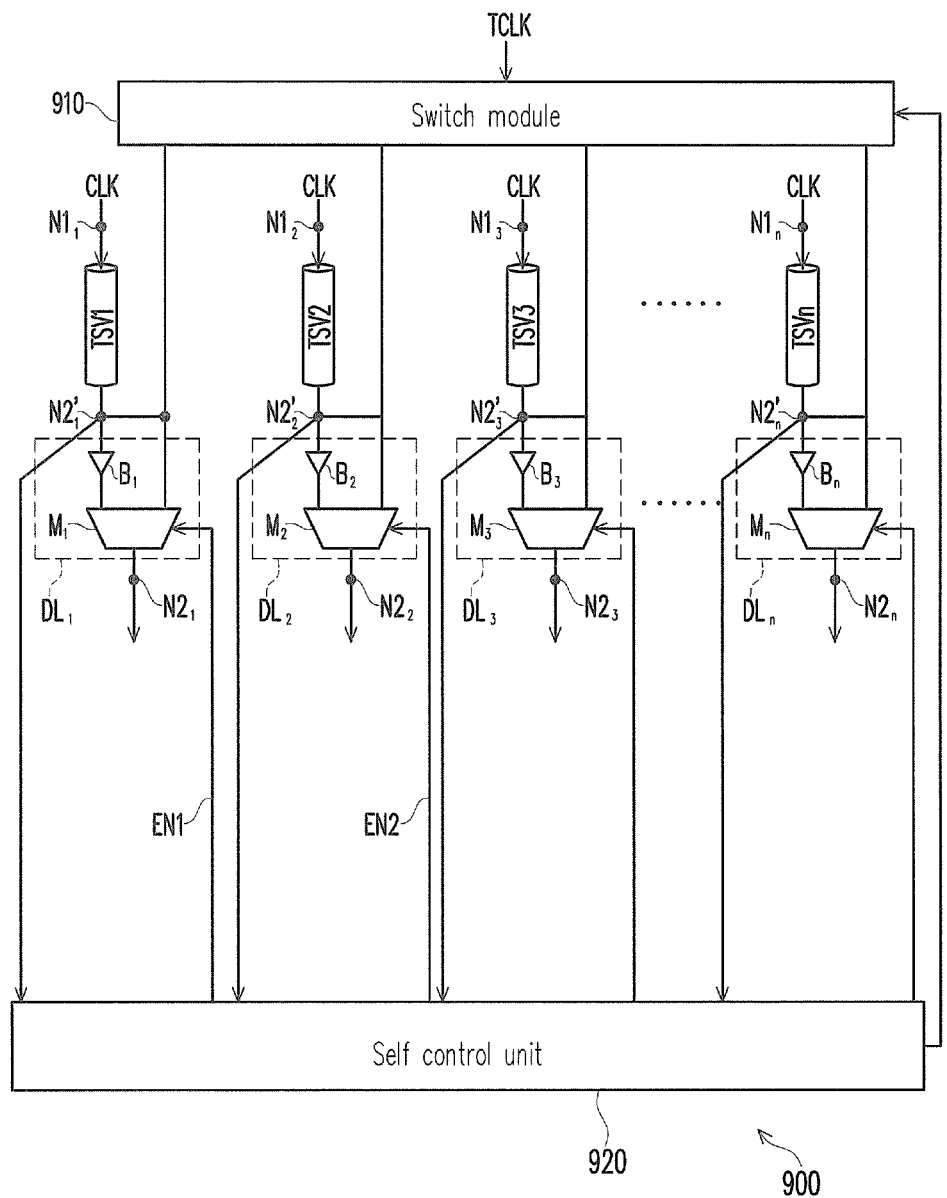
FIG. 9 is a functional block schematic diagram of a fault-tolerant unit for TSV according to another exemplary embodiment of the disclosure.

FIG. 9 is a functional block schematic diagram of a fault-tolerant unit 900 for TSV according to another exemplary embodiment of the disclosure. The fault-tolerant unit 900 for TSV includes n TSV structures (for example, TSV1, TSV2, TSV3, . . . , TSVn in FIG. 9), n first nodes (for example, $N1_1$, $N1_2$, $N1_3$, . . . , $N1_n$ in FIG. 9), n second nodes (for example, $N2_1$, $N2_2$, $N2_3$, . . . , $N2_n$ in FIG. 9), n delay adjustment modules (for example, $DL_1$, $DL_2$, $DL_3$, . . . , $DL_n$ in FIG. 9), a switch module 910 and a self control unit 920, where n is an integer. Related descriptions of the fault-tolerant unit 200 can be referred for an implementation of the fault-tolerant unit 900. Different to the fault-tolerant unit 200, the second fault-tolerant switches (for example, the second fault-tolerant switches TG1x-TGnx of FIG. 3) are omitted in the fault-tolerant unit 900.

Referring to FIG. 9, if a signal delay amount for the switch module 910 transmitting the clock signal CLK is less than a circuit design specification, namely the signal delay amount of the switch module 910 is tolerable, the delay adjustment modules $DL_1$-$DL_n$ shown in FIG. 9 can be omitted/removed. If the delay adjustment module $DL_i$ is omitted, the second node $N2_i$ is directly connected to the node $N2_i'$ and the switch module 910, namely, the node $N2_i'$ is connected to a clock tree in the second chip 420.

Figure 10:
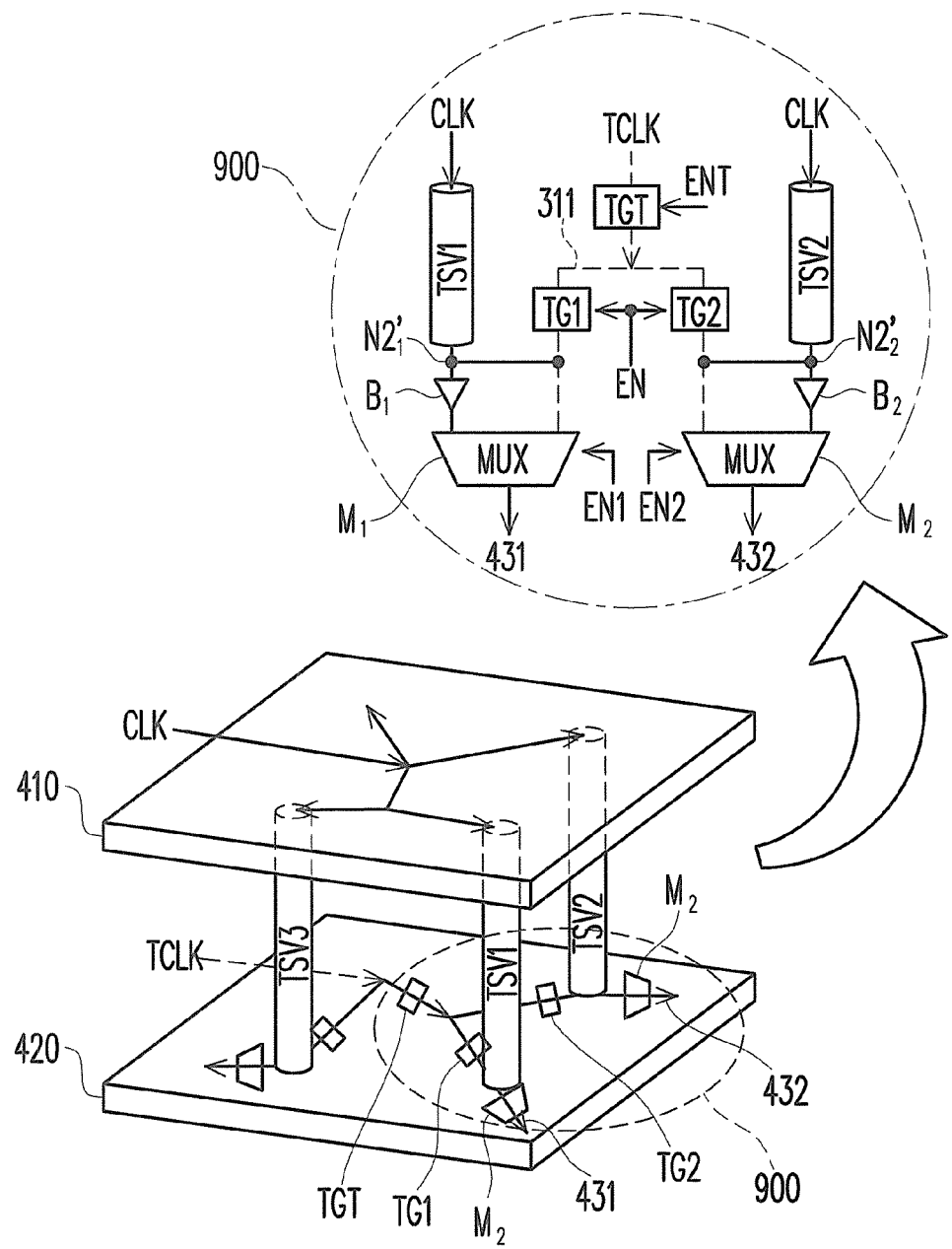
FIG. 10 is a schematic diagram of the fault-tolerant unit for TSV of FIG. 9 according to an exemplary embodiment of the disclosure.

FIG. 10 is a schematic diagram of the fault-tolerant unit 900 for TSV of FIG. 9 according to the exemplary embodiment of the disclosure. Related descriptions of FIG. 2 and FIG. 5 can be referred for the exemplary embodiment of FIG. 10. The switch module 910 includes the redundant path 311, the test switch TGT and n fault-tolerant switches. In the present exemplary embodiment, n is 2, so that only the fault-tolerant switches TG1 and TG2 are illustrated in FIG. 10. Referring to a lower part of FIG. 10, the TSV structures TSV1, TSV2 and TSV3 are configured between the first chip 410 and the second chip 420, so that the clock signal CLK of the first chip 410 can be transmitted to different clock trees of the second chip 420 through the TSV structures TSV1, TSV2 and TSV3. The upper part of FIG. 10 is an equivalent circuit of the fault-tolerant unit 900 for TSV on the second chip 420 after the chip stacking.

Within a predetermined time after power on, after the circuit and devices are stable, the self control unit 920 can detect whether the test path has the clock signal TCLK for once, and detects whether the nodes $N2_1'$-$N2_n'$ have signals for once. Before the chip stacking, when the test path used for transmitting the clock signal TCLK has the signal, the self control unit 920 turns on the test switch TGT through the control signal ENT, so that the test path is connected to the redundant path 311. When none of the nodes $N2_1'$-$N2_n'$ has a signal, the self control unit 920 turns on the fault-tolerant switches TG1-

TG2 through the control signal EN. Meanwhile, the self control unit 320 controls the multiplexer $M_1$ to connect the fault-tolerant switch TG1 of the switch module 910 to the clock tree 431 through the control signal EN1, and controls the multiplexer $M_2$ to connect the fault-tolerant switch TG2 of the switch module 910 to the clock tree 432 through the control signal EN2. In the test state, the clock signal TCLK used for testing can be transmitted to the clock tree 431 through the test path, the redundant path 311, the switch TG1 and the multiplexer $M_1$, and transmitted to the clock tree 432 through the test path, the redundant path 311, the switch TG2 and the multiplexer $M_2$.

After the chip stacking, the second chip 420 can normally operate. Namely, the TSV structures TSV1-TSVn are respectively connected to the nodes $N2_1'$-$N2_n'$, and the test path no longer transmits the clock signal TCLK. Therefore, the self control unit 920 turns off the test switch TGT through the control signal ENT, so that the redundant path 311 is isolated from the test path. The self control unit 920 can detect the nodes $N2_1'$ and $N2_2'$ to identify whether the TSV structures TSV1 and TSV2 are faulty. When the self control unit 920 detects that the TSV structures TSV1 and TSV2 are all valid (i.e. the nodes $N2_1'$ and $N2_2'$ have signals), the self control unit 920 stops detecting the TSV structures TSV1-TSVn, i.e. stops detecting the nodes $N2_1'$ and $N2_2'$. Then, the self control unit 920 turns off the fault-tolerant switches TG1-TG2 through the control signal EN. Meanwhile, the self control unit 920 controls the multiplexer $M_1$ to connect the output terminal of the buffer $B_1$ to the clock tree 431 through the control signal EN1, and controls the multiplexer $M_2$ to connect the output terminal of the buffer $B_2$ to the clock tree 432 through the control signal EN2. Therefore, the clock signal CLK can be transmitted to the clock tree 431 through the TSV structure TSV1, the node $N2_1'$, the buffer $B_1$ and the multiplexer $M_1$, and the clock signal CLK can also be transmitted to the clock tree 432 through the TSV structure TSV2, the node $N2_2'$, the buffer $B_2$ and the multiplexer $M_2$.

When the self control unit 920 detects that the TSV structure TSV1 is faulty, i.e. detects that the node $N2_1'$ does not have a signal, the self control unit 920 stops detecting the TSV structures TSV1-TSV2. Then, besides turning off the test switch TGT through the control signal ENT, the self control unit 920 further turns on the fault-tolerant switches TG1-TG2 through the control signal EN. Meanwhile, the self control unit 920 controls the multiplexer $M_1$ to connect the fault-tolerant switch TG1 to the clock tree 431 through the control signal EN1, and controls the multiplexer $M_2$ to connect the output terminal of the buffer $B_2$ to the clock tree 432 through the control signal EN2. Therefore, besides that the TSV structure TSV2 transmits the clock signal CLK to the clock tree 432 through the node $N2_2'$, the buffer $B_2$ and the multiplexer $M_2$, the TSV structure TSV2 also transmits the clock signal CLK to the clock tree 431 through the node $N2_2'$, the fault-tolerant switch TG2, the redundant path 311, the fault-tolerant switch TG1 and the multiplexer $M_1$. A delay time of the buffer $B_2$ is approximately equal to a total delay time of the fault-tolerant switch TG2, the redundant path 311 and the fault-tolerant switch TG1. Therefore, the clock tree 431 corresponding to the faulty TSV structure TSV1 can obtain the clock signal CLK from the valid TSV structure TSV2.

Deduced by analogy, when the self control unit 920 detects that the TSV structure TSV2 is faulty, i.e. detects that the node $N2_2'$ does not have a signal, the self control unit 920 stops detecting the TSV structures TSV1-TSV2. Then, the self control unit 320 controls the multiplexer $M_1$ to connect the output terminal of the buffer $B_1$ to the clock tree 431 through the control signal EN1, and controls the multiplexer $M_2$ to connect the fault-tolerant switch TG2 to the clock tree 432 through the control signal EN2. Therefore, besides that the TSV structure TSV1 transmits the clock signal CLK to the clock tree 431 through the node $N2_1'$, the buffer $B_1$ and the multiplexer $M_1$, the TSV structure TSV1 also transmits the clock signal CLK to the clock tree 432 through the fault-tolerant switch TG1, the redundant path 311, the fault-tolerant switch TG2 and the multiplexer $M_2$. A delay time of the buffer $B_1$ is approximately equal to a total delay time of the fault-tolerant switch TG1, the redundant path 311 and the fault-tolerant switch TG2. Therefore, the clock tree 432 corresponding to the faulty TSV structure TSV2 can obtain the clock signal CLK from the valid TSV structure TSV1.

Table 2 is a truth table of the above switches TG1, TG2 and TGT. The control signals ENT, EN, EN1 and EN2 used for controlling the switches TG1, TG2, and TGT and the multiplexers $M_1$ and $M_2$ can be set according to a manual mechanism, or can be automatically set by the self control unit 920 according to the states of the TSV structures TSV1 and TSV2.

TABLE 2 truth table of the switches TG1, TG2, TGT and the multiplexers $M_1$ and $M_2$ of FIG. 10

| Stage | TSV structure | TGT | TG1 | TG2 | $M_1$ | $M_2$ |
|---|---|---|---|---|---|---|
| After stacking | valid | OFF | OFF | OFF | TSV1 | TSV2 |
| | TSV1 is faulty | OFF | ON | ON | TSV2 (Not through buffer) | TSV2 (Through buffer) |
| | TSV2 is faulty | OFF | ON | ON | TSV1 (Through buffer) | TSV1 (Not through buffer) |
| Before stacking | None | ON | ON | ON | TCLK | TCLK |

The above manual mechanism is, for example, to set the connection states of the switches TG1, TG2, TGT and the multiplexers $M_1$ and $M_2$ according to a fuse mechanism. If it is discovered that the TSV structure TSV1 is faulty in the test/verification performed after the chip stacking, a fuse configuration is changed in a subsequent process to set the connection states of the switches TG1, TG2, TGT and the multiplexers $M_1$ and $M_2$ according to the table 2.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A fault-tolerant unit for through-silicon via (TSV), comprising:
    n TSV structures TSV1-TSVn, wherein n is an integer;
    n first nodes $N1_1$-$N1_n$, disposed on a first chip of a chip stacking structure;
    n second nodes $N2_1$-$N2_n$, disposed on a second chip of the chip stacking structure, wherein the TSV structure TSVi is electrically connected between the first node $N1_i$ and the second node $N2_i$, and $1 \le i \le n$; and
    a switch module, disposed on the second chip, and connected between the second nodes $N2_1$-$N2_n$ and a test path of the second chip; wherein the switch module disconnects the test path and the second nodes $N2_1$-$N2_n$ when the TSV structures TSV1-TSVn are valid in a normal operation state; the switch module connects the second node $N2_i$ to at least one of the other second nodes when the TSV structure TSVi is faulty in the normal operation state; and the switch module connects the test path to the second nodes $N2_1$-$N2_n$ in a test state.

2. The fault-tolerant unit for TSV as claimed in claim 1, wherein the chip stacking structure further comprises at least one third chip stacked between the first chip and the second chip, and the TSV structures TSV1-TSVn penetrate through the at least one third chip and are electrically connected between the first nodes $N1_1$-$N1_n$ and the second nodes $N2_1$-$N2_n$.

3. The fault-tolerant unit for TSV as claimed in claim 1, wherein the switch module comprises:
   a redundant path;
   a test switch, connected between the redundant path and the test path, wherein in the normal operation state, the test switch is turned off, and in the test state, the test switch is turned on;
   n first fault-tolerant switches TG1-TGn, wherein a first terminal and a second terminal of a first fault-tolerant switch TGi of the first fault-tolerant switches are respectively coupled to the redundant path and a second node $N2_i$ of the second nodes; and
   n second fault-tolerant switches TG1x-TGnx, wherein a first terminal and a second terminal of a second fault-tolerant switch TGix of the second fault-tolerant switches are respectively coupled to the TSV structure TSVi and the second terminal of the first fault-tolerant switch TGi,
   wherein the first fault-tolerant switches TG1-TGn are turned on and the second fault-tolerant switches TG1x-TGnx are turned off in the test state; the first fault-tolerant switches TG1-TGn are turned off when the TSV structures TSV1-TSVn are valid in the normal operation state;
   and the first fault-tolerant switch TGi and another one of the first fault-tolerant switches TG1-TGn are turned on, and the other first fault-tolerant switches are turned off, the second fault-tolerant switch TGix is turned off, and the other second fault-tolerant switches are turned on when the TSV structures TSVi is faulty in the normal operation state.

4. The fault-tolerant unit for TSV as claimed in claim 3, further comprising:
   a self control unit, having an $i^{th}$ detecting terminal connected to the TSV structure TSVi, a plurality of output terminals respectively connected to a control terminal of the test switch, a control terminal of the first fault-tolerant switch TGi and a control terminal of the second fault-tolerant switch TGix,
   wherein the self control unit controls the test switch to connect the test path to the redundant path when the test path has a signal; the self control unit turns on the second fault-tolerant switch TGix when the TSV structure TSVi has a signal; and the self control unit turns off the second fault-tolerant switch TGix, turns on the first fault-tolerant switch TGi and another one of the first fault-tolerant switches TG1-TGn, and turns off the other first fault-tolerant switches when the TSV structure TSVi does not have a signal.

5. The fault-tolerant unit for TSV as claimed in claim 1, wherein the switch module comprises:
   a redundant path;
   a test switch, connected between the redundant path and the test path, wherein the test switch is turned off in the normal operation state, and the test switch is turned on in the test state; and
   n fault-tolerant switches TG1-TGn, wherein a first terminal of the fault-tolerant switch TGi is coupled to the redundant path, and a second terminal of the fault-tolerant switch TGi is coupled to the TSV structure TSVi and the second node $N2_i$,
   wherein the fault-tolerant switches TG1-TGn are turned on in the test state; the fault-tolerant switches TG1-TGn are turned off when the TSV structures TSV1-TSVn are valid in the normal operation state; and the fault-tolerant switch TGi and another one of the fault-tolerant switches TG1-TGn are turned on, and the other fault-tolerant switches are turned off when the TSV structures TSVi is faulty in the normal operation state.

6. The fault-tolerant unit for TSV as claimed in claim 5, further comprising:
   a self control unit, having an $i^{th}$ detecting terminal connected to the TSV structure TSVi, a plurality of output terminals respectively connected to a control terminal of the test switch and a control terminal of the fault-tolerant switch TGi,
   wherein the self control unit controls the test switch to connect the test path to the redundant path when the test path has a signal; when the self control unit detects that the TSV structures TSV1-TSVn all have signals, the self control unit stops detecting the TSV structures TSV1-TSVn, and turns off the fault-tolerant switch TG1-TGn; and when the self control unit detects that the TSV structure TSVi does not have a signal, the self control unit stops detecting the TSV structures TSV1-TSVn, turns on the fault-tolerant switch TGi and another one of the fault-tolerant switches TG1-TGn, and turns off the other fault-tolerant switches.

7. The fault-tolerant unit for TSV as claimed in claim 1, wherein the second node $N2_i$ is connected to a clock tree of the second chip.

8. The fault-tolerant unit for TSV as claimed in claim 1, further comprising:
   n delay adjustment modules $DL_1$-$DL_n$, disposed on the second chip, wherein the delay adjustment module $DL_i$ is coupled between the second node $N2_i$ and the TSV structure TSVi, and coupled between the second node $N2_i$ and the switch module,
   wherein the delay adjustment module $DL_i$ transmits a signal between the TSV structure TSVi and the second node $N2_i$ by a first delay time when the TSV structure TSVi is valid, and the delay adjustment module $DL_i$ transmits a signal between the switch module and the second node $N2_i$ by a second delay time smaller than the first delay time when the TSV structure TSVi is faulty.

9. The fault-tolerant unit for TSV as claimed in claim 8, wherein the delay adjustment module $DL_i$ comprises:
   a buffer, having an input terminal coupled to the TSV structure TSVi; and
   a multiplexer, having a first input terminal coupled to an output terminal of the buffer, a second input terminal coupled to the switch module, and an output terminal coupled to the second node $N2_i$;
   wherein the multiplexer connects the switch module to the second node $N2_i$ when the TSV structure TSVi is faulty, and the multiplexer connects the output terminal of the buffer to the second node $N2_i$ when the TSV structure TSVi is valid.

10. The fault-tolerant unit for TSV as claimed in claim 9, wherein the switch module comprises:
    a redundant path;

a test switch, connected between the redundant path and the test path, wherein the test switch is turned off in the normal operation state, and the test switch is turned on in the test state;

n first fault-tolerant switches TG1-TGn, wherein a first terminal of the first fault-tolerant switch TGi is coupled to the redundant path, and a second terminal of the first fault-tolerant switch TGi is coupled to the second input terminal of the multiplexer; and n second fault-tolerant switches TG1x-TGnx, wherein a first terminal and a second terminal of the second fault-tolerant switch TGix are respectively coupled to the TSV structure TSVi and the second terminal of the first fault-tolerant switch TGi, wherein the first fault-tolerant switches TG1-TGn are turned on and the second fault-tolerant switches TG1x-TGnx are turned off in the test state; the first fault-tolerant switches TG1-TGn are turned off when the TSV structures TSV1-TSVn are valid in the normal operation state; and the first fault-tolerant switch TGi and another one of the first fault-tolerant switches TG1-TGn are turned on, and the other first fault-tolerant switches are turned off, the second fault-tolerant switch TGix is turned off, and the other second fault-tolerant switches are turned on when the TSV structures TSVi is faulty in the normal operation state.

11. The fault-tolerant unit for TSV as claimed in claim 9, wherein the switch module comprises:
a redundant path;
a test switch, connected between the redundant path and the test path, wherein the test switch is turned off in the normal operation state, and the test switch is turned on in the test state; and
n fault-tolerant switches TG1-TGn, wherein a first terminal of the fault-tolerant switch TGi is coupled to the redundant path, and a second terminal of the fault-tolerant switch TGi is coupled to the TSV structure TSVi and the second input terminal of the multiplexer,
wherein e fault-tolerant switches TG1-TGn are turned on in the test state; the fault-tolerant switches TG1-TGn are turned off when the TSV structures TSV1-TSVn are valid in the normal operation state; and the fault-tolerant switch TGi and another one of the fault-tolerant switches TG1-TGn are turned on, and the other fault-tolerant switches are turned off when the TSV structures TSVi is faulty in the normal operation state.

12. The fault-tolerant unit for TSV as claimed in claim 9, wherein the delay adjustment module DL; further comprises:
a self control unit, having a detecting terminal connected to the TSV structure TSVi, and an output terminal connected to a control terminal of the multiplexer;
wherein the self control unit controls the multiplexer to connect the output terminal of the buffer to the second node $N2_i$ when the TSV structure TSVi has a signal, and the self control unit controls the multiplexer to connect the switch module to the second node $N2_i$ when the TSV structure TSVi does not have a signal.

13. A fault-tolerant method for through-silicon via (TSV), comprising:
configuring n TSV structures TSV1-TSVn between a first chip and a second chip of a chip stacking structure, wherein the TSV structure TSVi is electrically connected between a first node $N1_i$ of the first chip and a second node $N2_i$ of the second chip, where $1 \le i \le n$, and n is an integer;
disposing a switch module on the second chip, wherein the switch module is connected between the second nodes $N2_1$-$N2_n$ and a test path of the second chip;
disconnecting the test path and the second nodes $N2_1$-$N2_n$ by the switch module when the TSV structures TSV1-TSVn are valid in a normal operation state;
connecting the second node $N2_i$ to at least one of another second nodes by the switch module when the TSV structure TSVi is faulty in the normal operation state; and
connecting the test path to the second nodes $N2_1$-$N2_n$ by the switch module in a test state.

14. The fault-tolerant method for TSV as claimed in claim 13, wherein the chip stacking structure further comprises at least one third chip stacked between the first chip and the second chip, and the TSV structures TSV1-TSVn penetrate through the at least one third chip and are electrically connected between the first nodes $N1_1$-$N1_n$ and the second nodes $N2_1$-$N2_n$.

15. The fault-tolerant method for TSV as claimed in claim 13, further comprising:
transmitting a signal of the TSV structure TSVi to the second node $N2_i$ by a first delay time when the TSV structure TSVi is valid; and
transmitting a signal of the switch module to the second node $N2_i$ by a second delay time smaller than the first delay time when the TSV structure TSVi is faulty.

* * * * *